US012619796B2

(12) United States Patent
List et al.

(10) Patent No.: US 12,619,796 B2
(45) Date of Patent: May 5, 2026

(54) VIRTUAL ENVIRONMENT FOR LARGE-SCALE CAPITAL PROJECTS

(71) Applicant: Hexagon Technology Center GmbH, Heerbrugg (CH)

(72) Inventors: Christian List, Madison, AL (US); Joseph Chad Shupe, Madison, AL (US); Brian D. Scarsdale, Hampton, VA (US); Jiti Kottukappallil, Madison, AL (US)

(73) Assignee: Hexagon Technology Center GmbH, Heerbrugg (CH)

( * ) Notice: Subject to any disclaimer, the term of this patent is extended or adjusted under 35 U.S.C. 154(b) by 73 days.

(21) Appl. No.: 17/899,130

(22) Filed: Aug. 30, 2022

(65) Prior Publication Data

US 2024/0070333 A1 Feb. 29, 2024

(51) Int. Cl.
*G06F 30/12* (2020.01)
*G06F 30/13* (2020.01)
*G06Q 10/10* (2023.01)

(52) U.S. Cl.
CPC .............. *G06F 30/12* (2020.01); *G06F 30/13* (2020.01); *G06Q 10/103* (2013.01)

(58) Field of Classification Search
CPC ........ G06F 30/12; G06F 30/13; G06Q 10/103
USPC ........................................................ 715/733
See application file for complete search history.

(56) References Cited

U.S. PATENT DOCUMENTS

| | | | |
|---|---|---|---|
| 11,758,090 B1 * | 9/2023 | Little .................. | G06Q 50/163 |
| | | | 348/14.08 |
| 2008/0140732 A1 * | 6/2008 | Wilson ................ | G06F 16/1873 |
| 2010/0223032 A1 * | 9/2010 | Reghetti ................ | G06T 19/20 |
| | | | 703/1 |
| 2011/0112971 A1 * | 5/2011 | Wynn ................... | G06Q 10/10 |
| | | | 709/204 |
| 2013/0124956 A1 * | 5/2013 | Hatfield ................ | G06F 40/197 |
| | | | 715/211 |
| 2013/0124967 A1 * | 5/2013 | Hatfield ................. | G06T 11/60 |
| | | | 715/233 |
| 2013/0132043 A1 * | 5/2013 | Wayne ................... | G06F 30/13 |
| | | | 703/1 |

(Continued)

OTHER PUBLICATIONS

International Search Report and Written Opinion for International Application No. PCT/US2023/028577 mailed Oct. 30, 2023 (13 pages).

*Primary Examiner* — Stephen S Hong
*Assistant Examiner* — Ahamed I Nazar
(74) *Attorney, Agent, or Firm* — Nutter McClennen & Fish LLP

(57) ABSTRACT

A method generates a virtual environment representing a large-scale capital project with a plurality of objects. Each object corresponds to at least one of a plurality of files. The method further associates a user indicator with a given object of the plurality of objects after access to a given file. The given file is at least one of the plurality of files and associated with the given object. The method also positions a visual representation of the user indicator in the virtual environment as a function of the given object. The visual representation of the user indicator includes an interactive interface for user information. The method further receives a request via the interactive interface to contact a user corresponding to the user indicator.

20 Claims, 7 Drawing Sheets

400

(56) References Cited

U.S. PATENT DOCUMENTS

| | | | |
|---|---|---|---|
| 2014/0310345 A1* | 10/2014 | Megiddo | G06Q 10/101 |
| | | | 709/204 |
| 2019/0028287 A1* | 1/2019 | Jin | G06F 16/13 |
| 2020/0151287 A1 | 5/2020 | McCool et al. | |

* cited by examiner

10

400

400

600

601 – Generate virtual environment

603 – Associate user indicator with object

605 – Update object in virtual environment

607 – Determine object location

609 – Determine appearance characteristic

611 – Position user indicator

613 – Receive user information request

615 – Associate user indicator with second object

617 – Determine second object location

619 – Reposition user indicator

700

VIRTUAL ENVIRONMENT FOR LARGE-SCALE CAPITAL PROJECTS

FIELD

Illustrative embodiments of the invention generally relate to virtual environments and, more particularly, various embodiments of the invention relate to virtual environments configured to mitigate design file conflicts in large-scale capital projects.

BACKGROUND

Existing project management software applications suffer from a number of shortcomings and disadvantages. Among other things, this may include preventing design conflicts such as overlaps and redundancies. Large-scale capital projects may involve hundreds of personnel designing thousands of components and systems for a single plant model. However, an engineer contributing a design file for placing electrical components at one location of the model may be unaware of a previously submitted design file for water pipes placed by another engineer in the same location, causing a design conflict that may not be discovered until the entire plant model is later refreshed.

SUMMARY OF VARIOUS EMBODIMENTS

In accordance with one embodiment, a method for managing a large-scale capital project generates a virtual environment representing the large-scale capital project. The virtual environment includes a plurality of objects, and each of the plurality of objects corresponds to at least one of a plurality of files. The method associates a user indicator with a given object of the plurality of objects after access to a given file. The given file is at least one of the plurality of files, and the given file is associated with the given object in the virtual environment. The method positions a visual representation of the user indicator in the virtual environment as a function of the given object. The visual representation of the user indicator has an interactive interface for user information. The method further receives a request via the interactive interface to contact a user corresponding to the user indicator.

In some embodiments, associating the user indicator with the given object occurs in response to a modification of the given object by a user corresponding to the user indicator.

The method may include updating the given object in the virtual environment in response to the modification of the given object by the user.

The method may include determining a location of the given object in the virtual environment. Positioning the visual representation of the user indicator in the virtual environment may be a function of the location of the given object. The method may also include associating the user indicator with a second object of the plurality of objects after access to a second file. The second file is at least one of the plurality of files. The second file is associated with the second object in the virtual environment. The method may also include determining a second location of the second object in the virtual environment. The method may further include repositioning the visual representation of the user indicator in the virtual environment as a function of the second location of the second object.

The method may include assigning an appearance characteristic of the user indicator in the virtual environment in response to at least a portion of the plurality of objects located proximate to the given object.

In some embodiments, the user indicator includes an avatar representation of the user. The avatar representation may include at least one of a work classification visual representation and a work status visual representation.

Illustrative embodiments are implemented as a system including 1) a user input, a 2) renderer configured to generate a virtual environment representing the large-scale capital project, and 3) a user associator configured to associate a user indicator with a given object of the plurality of objects after access to a given file. The virtual environment includes a plurality of objects. Each of the plurality of objects corresponding to at least one of a plurality of files. The user associator. The given file is at least one of the plurality of files, and the given file is associated with the given object in the virtual environment. The renderer then determines a location of the given object in the virtual environment and positions a visual representation of the user indicator in the virtual environment as a function of the location of the given object. The visual representation of the user indicator has an interactive interface for user information. The user input then receives, from a user device, a request via the interactive interface to access the user information.

Illustrative embodiments are implemented as a computer program product having a computer usable medium with computer readable program code thereon. The computer readable code may be read and utilized by a computer system in accordance with conventional processes.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Illustrative embodiments provide a graphical user interface configured for mitigating the likelihood of design conflicts in models of large-scale capital projects. Large-scale capital projects have an enormous number of interconnected objects, and generally require hundreds of engineers to generate design files for each of these objects. Two engineers working on different design files for different objects may create design conflicts if the objects share a space of the large-scale capital project. A design conflict may occur when two different objects require the same space, or two redundant components are designed by different engineers, to name but a few examples. Illustrative embodiments provide a virtual environment to allow engineers to more readily anticipate or identify design file conflicts arising from multiple engineers working on the same large-scale capital project.

Figure 1A:
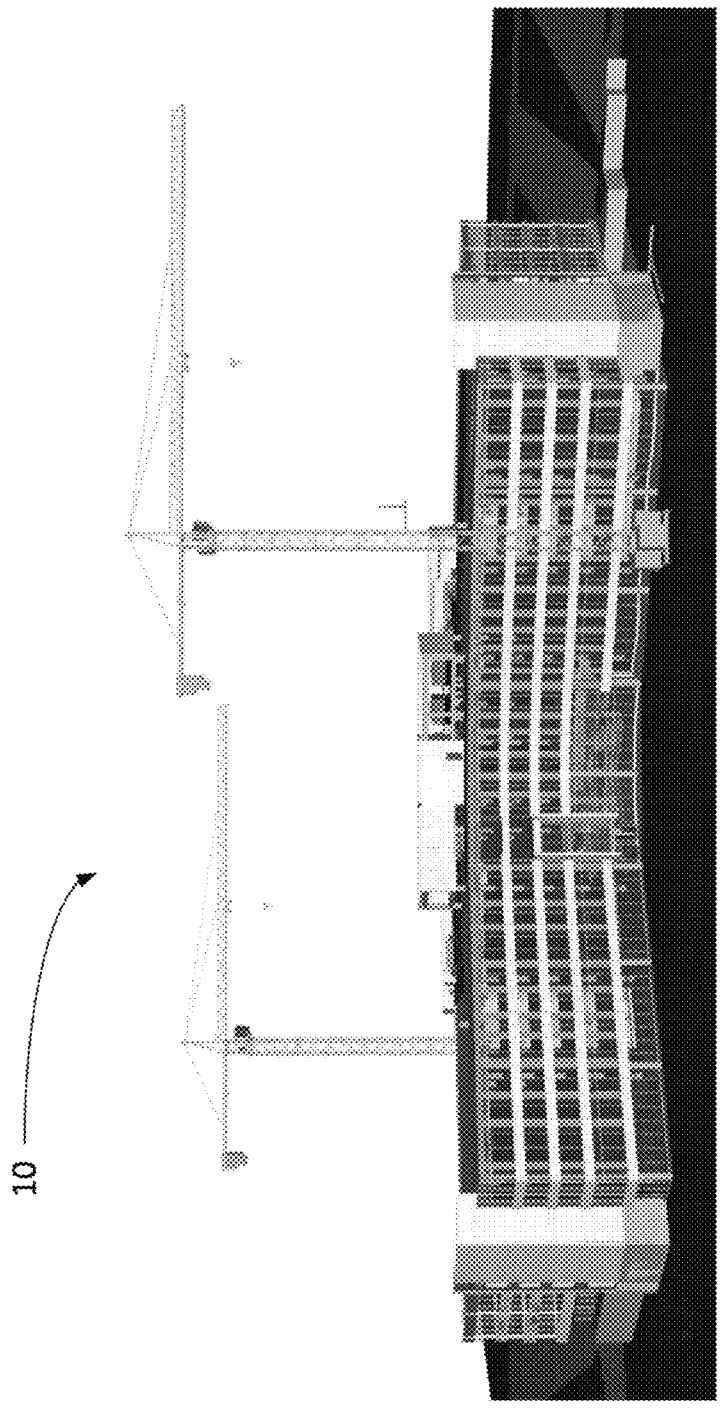
FIGS. 1A-1B illustrate exemplary large-scale capital projects that may use the project management systems of various embodiments.

FIG. 1A generally shows one example of a large-scale capital project 10 (also referred to as "capital project 10") that may implement illustrative embodiments of the invention. More specifically, as known by those skilled in the art, the capital project 10 generally is a long-term investment made to build, augment, add, or improve on a highly capital-intensive project—it requires notable amounts of both financial capital and labor capital to undertake, and often takes years to complete. Capital projects 10 are often defined by their large-scale cost relative to other investments requiring less planning and resources (e.g., building a house or a truck). Both the private sector and public sector can be involved in the capital project 10. Some examples of large-scale capital projects 10 include developing and maintaining airports, hospitals, tall buildings, bridges & tunnel, and road projects. Additionally, or alternatively, illustrative embodiments may be used with oil refineries, power plants, ships, offshore oil platforms, dams, and factories.

Figure 1B:
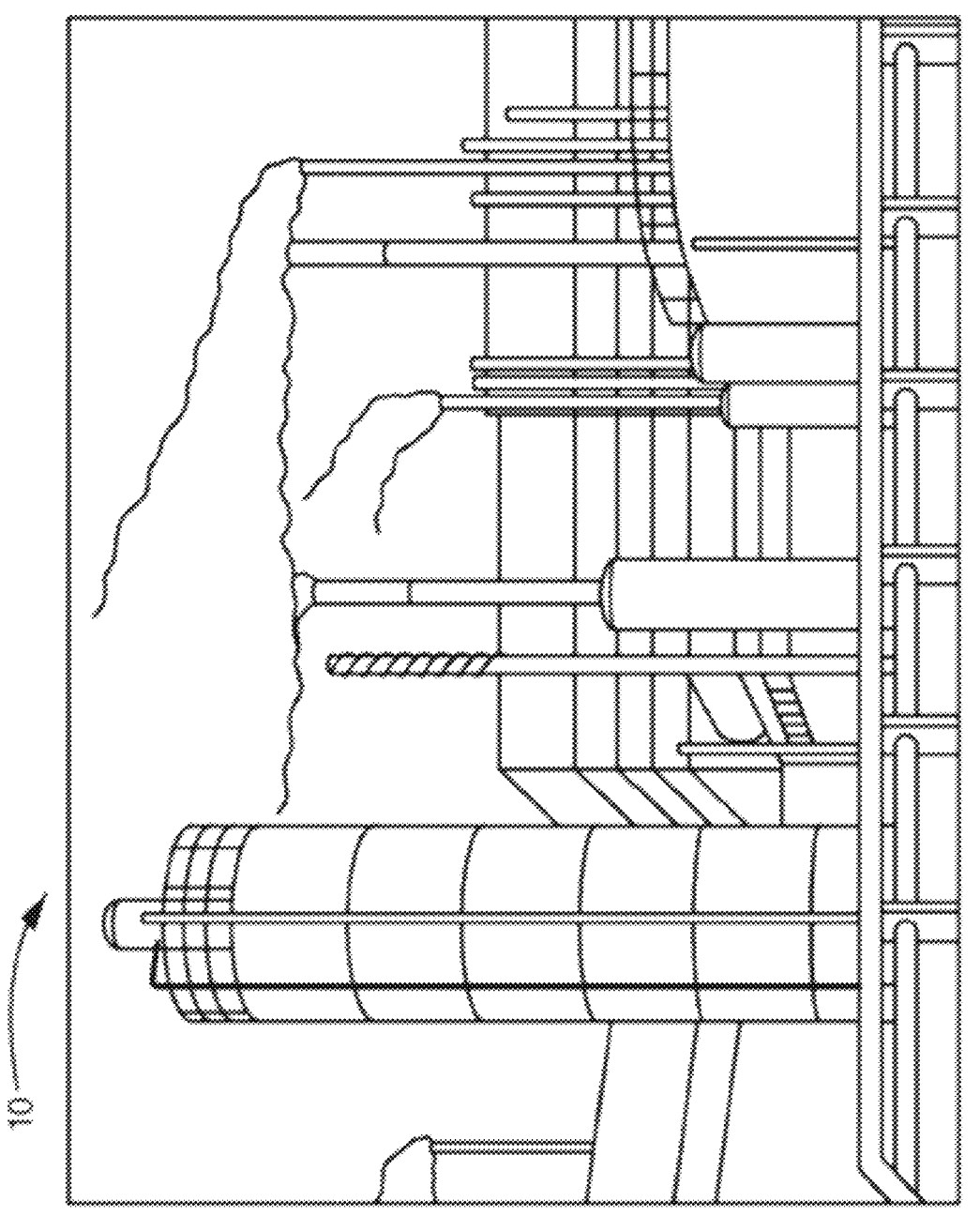

Illustrative embodiments of the invention may be advantageously used with a variety of types of capital projects 10. FIG. 1B schematically shows a power plant, which, as known by those skilled in the art, has an enormous number of different components that cooperate to accomplish its function of generating power. For example, among other things, the power plant of this figure has a plurality of large and small buildings, smokestacks, pipes, valves, fuel tanks, ladders, and electrical systems. The capital project 10 shown in FIG. 1B is provided for the sake of showing a variety of large-scale capital projects that may benefit from illustrative embodiments of the invention, and illustrative embodiments are not intended to be limited thereto.

Designing, building, and maintaining large-scale capital projects requires vast amounts of planning and coordination. A large number of components must be properly positioned, oriented, and connected with other components in accordance with a projected schedule and budget. Without careful planning and coordination, the large-scale capital project 10 may never have been built or operated.

To that end, those skilled in the art have developed plant design programs/products ("plant design programs") to assist in planning/designing, developing, maintaining, and decommissioning capital projects 10, such as those shown in FIGS. 1A-1B. An example of a widely used building & infrastructure design program or plant design program is known as the Intergraph Smart® 3D product (hereinafter "Smart® 3D product"), distributed by Hexagon ALI of Huntsville, Alabama. In a manner similar to other such products, the above-noted modeling product has at least the following interrelated functions and components:

3D modeling and visualization,
 engineering and schematics,
 information management,
 procurement, fabrication, and construction,
 open integration with other proprietary and open systems.

Accordingly, architects, designers, engineers, developers, managers and other relevant parties use these and other features of design programs, such as the SmartBuild® and Smart® 3D products, to design, build, update, manage, and decommission capital projects 10, such as the buildings shown in FIGS. 1A-1B. Such 3D or 2D design programs may render models of the capital projects 10 based on design files corresponding to each capital project object. Working on one design file may require working in a space of the model occupied by other objects of the model corresponding to different design files. For example, one engineer may be designing a pipe system attached to a wall while another engineer may be designing an electrical system attached to the same wall. Since a capital project model is only updated periodically, such as when a workspace is refreshed, the two engineers will not be aware they have created a conflicting design until one or both engineers complete their design files and the model is later refreshed.

In illustrative embodiments, a system monitors the design files to identify where, withing the model/virtual environment, the engineers, administrators, or other designers (hereinafter "engineers" for simplicity) are working, and renders the virtual environment in a manner that also indicates where in the capital project each engineer is located/working. Each engineer may be identified by a visual representation of the engineer positioned, in the model, relative to the design file with which they are working. Accordingly, if a first user (e.g., an engineer) sees a second user in the virtual environment working on or near an object (i.e., working with/on a design file related to that object or a closely positioned object), the first user may use the virtual environment to contact the second user directly for any of a number of reasons. Among other things, the first user may contact the second user to coordinate design work, start a conversation about the project, pass a file to the second user, or some other collaborative business or social communication. In this way, a design conflict can be avoided instead of fixed after a model is refreshed.

Figure 2:
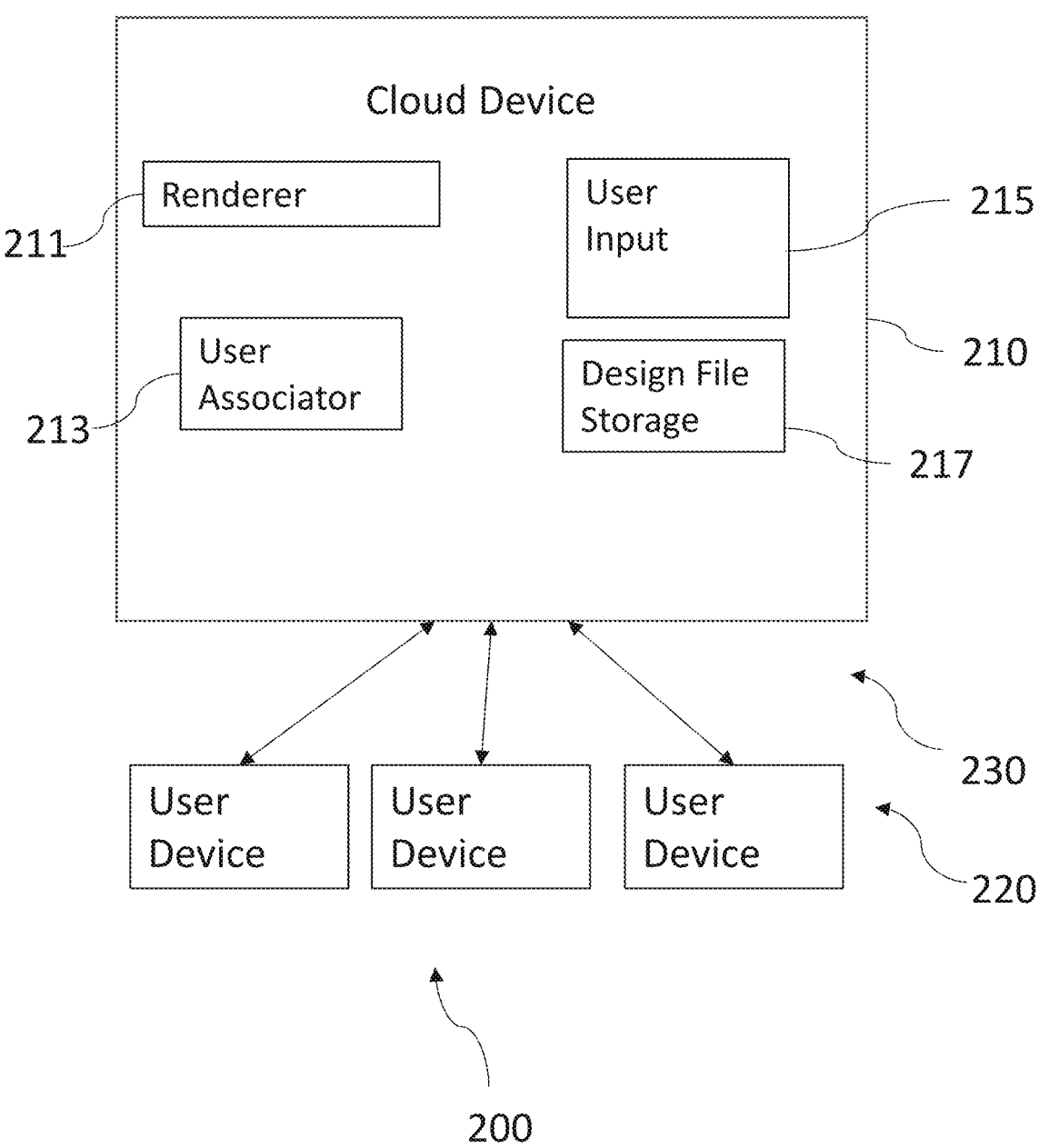
FIG. 2 schematically shows a block diagram illustrating an exemplary project management system configured in accordance with illustrative embodiments.

FIG. 2 schematically shows an exemplary project management system 200 configured to implement illustrative embodiments. It should be appreciated that system 200 may be implemented for a variety of large-scale capital projects, such as the projects identified in the description of FIGS. 1A-1B, to name but a few examples. It also should be appreciated that the topology of system 200 is illustrated for the purpose of explanation and is not intended as a limitation of various embodiments. Specifically, it should be noted that FIG. 2 only schematically shows components of the system 200. Those skilled in the art should understand that each of these components can be implemented in a variety of conventional manners, such as by using hardware, software, or a combination of hardware and software, across one or more other functional components and in a cloud or non-cloud environment. For example, the renderer may be implemented using a plurality of microprocessors executing firmware. As another example, the renderer may be implemented using one or more application specific integrated circuits (i.e., "ASICs") and related software, or a combination of ASICs, discrete electronic components (e.g., transistors), and microprocessors. Accordingly, the representation of the renderer and other components in a single box of FIG. 2 is for simplicity purposes only. In fact, in some embodiments, the renderer of FIG. 2 is distributed across a plurality of different machines—not necessarily within the same housing, data center, or chassis.

It should be reiterated that the representation of FIG. 2 is a significantly simplified representation. Those skilled in the art should understand that such a device can have many other physical and functional components, such as central processing units, short-term memory, etc. Accordingly, this discussion is in no way intended to suggest that FIG. 2 represents all of the elements of the system 200.

System 200 includes a cloud device 210 configured to monitor design files of a large-scale capital project and render the above noted virtual environment in response to monitored activity. Specifically, the cloud device 210 includes a renderer 211 configured to render the virtual environment, a user associator 213 configured to associate a user indicator with an object of the virtual environment, a user input 215 configured to receive requests from a user, and a design file storage 217 configured to store design files.

Renderer 211 is configured to generate a virtual environment representing a large-scale capital project. The virtual environment includes a plurality of objects representing components of the large-scale capital project. Each of the plurality of objects may include characteristics defined by a corresponding design file including size, shape, orientation, location, material, or color, to name but a few examples.

More specifically, the renderer 211 is also configured to generate a plurality of visual representations of user indicators in the virtual environment. Each user indicator includes some visual indicia associated with a user; namely, visual indicia configured to identify the user inside the virtual environment. For example, a visual representation of the user indicator may include an avatar representation of the user, or a shape with a color having some prescribed meaning. Another visual representation of the user indicator may include a shaded working space within the virtual environment.

To improve communication among the users, the visual representation preferably has an interactive interface for receiving and forwarding user information. The user information may include user contact information, such as a phone number, email address, or social media account information, to name but a few examples. In some embodiments, the contact information is selectable by a user such that system 200 is configured to allow two or more users to communicate after one user selects contact information of another user.

In some embodiments, the avatar representation may include a work classification visual representation to denote a technical specialty or an administrative title, to name but a few examples. For example, the avatar representation may use an icon, shape, or color to indicate a user is an electrical engineer, or to indicate a user is a supervisor.

The avatar representation may also include a work status visual representation to denote a user status, such as "working," "in a meeting," "away," "on vacation," or "offline," to name but a few examples. The avatar representation also may be shaded to indicate the user status (e.g., online, offline or "do not disturb").

The avatar representation may also illustrate a picture, 3D rendering, or other manifestation of the user, and/or other user characteristics, such as office location, engineering group within a company, company name, country of origin.

In certain embodiments, the renderer 211 may produce an appearance characteristic of the user indicator in response one or more of a plurality of objects in the virtual environment. For example, the visual representation of user indicators may flash or otherwise alter their appearance when another user is attempting to modify a design file in a way that would interfere with an object associated with a first user. In another example, visual representations of user indicators may flash or otherwise alter their appearance when two users are working within a proximity threshold. The proximity may be determined by a distance between objects, a number of objects between the two users, or two objects sharing a multi-dimensional space, to name but a few examples. In yet another example, a user's interaction with a related but spatially far object also can have an impact (e.g., similar objects on different ends of a power plant).

Design file storage 217 includes a file structure configured to store a plurality of design files. In certain embodiments, the file structure has a database configured to store and organize a plurality of design files, such as computer-aided design (CAD) files. Each of the plurality of objects in the virtual environment preferably corresponds to at least one of the design files of the plurality of design files. Depending upon their access rights, properly authorized users therefore may access, modify, add, or delete design files.

User associator 213 is configured to associate a user indicator with an object of the virtual environment corresponding to one or more design files in the plurality of design files. In certain embodiments, user associator 213 associates the user indicator with the design file most recently accessed by the user. In certain embodiments, user associator 213 associates the user indicator with the design file most recently modified by the user. User associator 213 may associate a user indicator with more than one design file simultaneously if a user has accessed or modified multiple design files at a time. User associator 213 may associate a user indicator with a new object when the user accesses a new design file after working on the initial design file.

With continuing reference to renderer 211, renderer 211 is configured to determine a location of an object of the virtual environment associated with a user indicator and position a visual representation of the user indicator as a function of the location. Renderer 211 may determine the location in response to the user associator 213, or while generating the virtual environment. Renderer 211 may position the visual representation of the user indicator as a function of the location by placing the visual representation above the given object, below the given object, or to the side of the given object, to name but a few examples. The visual representation of the user indicator may also be placed proximate to the corresponding objection in a place where the visual representation does not cover another user's visual representation of user indicator or another object of the virtual environment interacting with the given object.

As the user associator 213 associates a user indicator with new objects, renderer 211 dynamically repositions the visual representation of the user indicator as a function of the location of the new object. In certain embodiments, renderer 211 is configured to update an object in the virtual environment based on modifications to the corresponding design file in real-time or near real-time.

System 200 may be considered to also have a plurality of user devices 220 that can communicate with cloud device 210 by any of a number or conventional methods. For example, the user devices 220 may communicate with the user input 25 via a plurality of communication channels 230. Among others, those communication channels may be wireless and/or wired (e.g., the Internet). The user devices may be one or more of a computer, tablet, smartphone, smart monitor, Internet appliance, or other communication device that can implement the communication function.

After the virtual environment has been generated, it may be displayed to multiple users on the user devices of system 200. After the virtual environment has been generated and made available, a user may select one of the interactive interfaces corresponding to another user. Specifically, the user input 215 thus receives, from a user device 220, a request via the interactive interface to access the user information or other system information (e.g., information relating to the project). Accessing user information may include initiating a communication channel with the selected user, such as opening a chat window or opening an email draft, to name but a few examples. In some embodiments, the virtual environment may default to opening an email draft in response to determining a user to whom the email is to be sent is away from the virtual environment.

It should be appreciated that some or all of the foregoing features of system 200 may also be present in the other project management systems disclosed herein.

Figure 3:
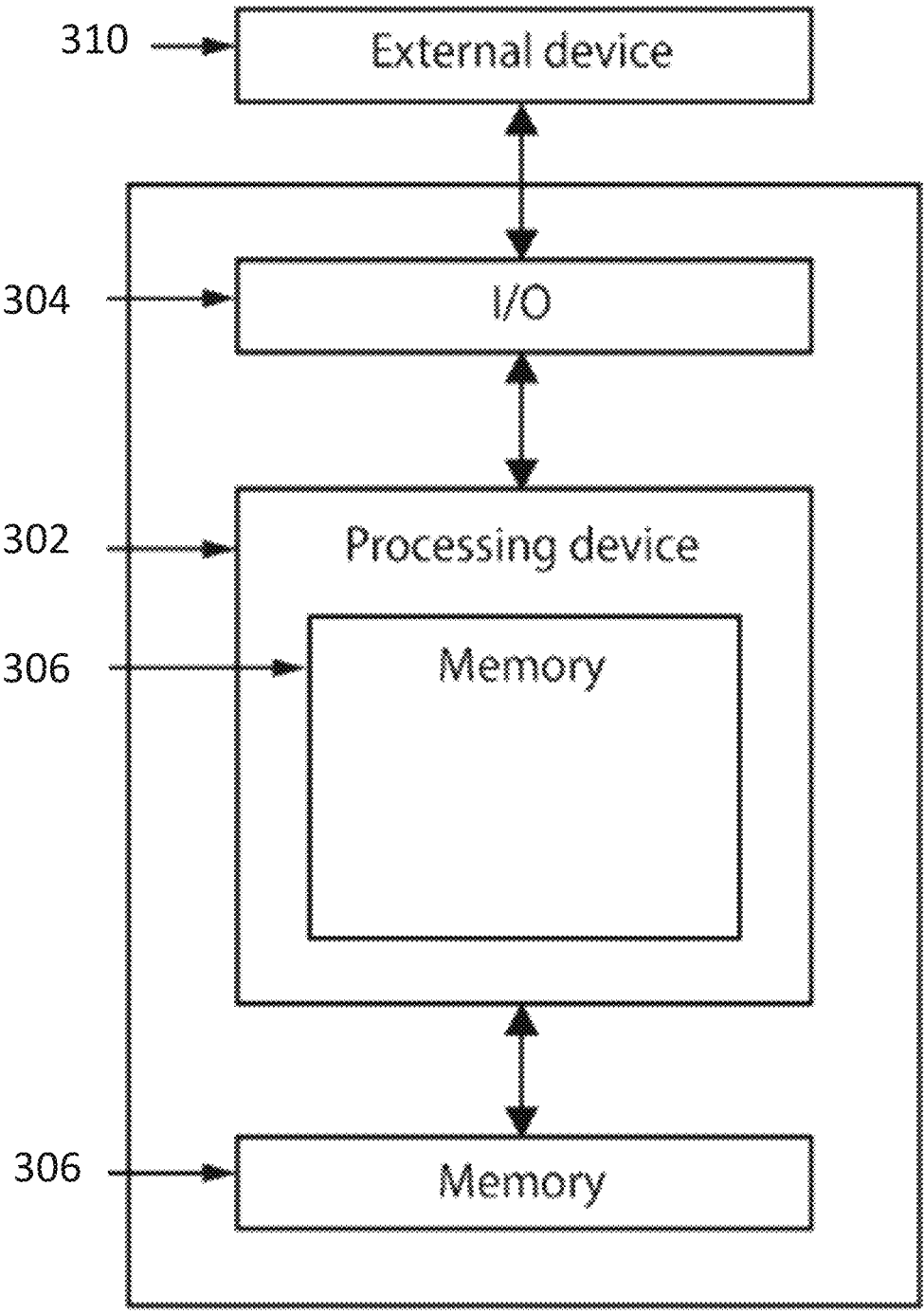
FIG. 3 schematically shows a block diagram illustrating an exemplary computing device.

FIG. 3 shows a schematic block diagram of a computing device 300. Computing device 300 is one example of a cloud device, user device, or circuit which is used, in different embodiments, in connection with an exemplary project management system, such as system 200 shown in FIG. 2. Computing device 300 includes a processing device 302, an input/output device 304, and a memory device 306. Computing device 300 may be a stand-alone device, an embedded system, or a plurality of devices configured to perform the functions described with respect to renderer 211, user associator 213, user input 215, and design file storage 217. Furthermore, computing device 300 may communicate with one or more external devices 310.

Input/output device 304 enables computing device 300 to communicate with external device 310. For example, input/output device 304 in different embodiments may be a network adapter, network credential, interface, or a port (e.g., a USB port, serial port, parallel port, an analog port, a digital port, VGA, DVI, HDMI, FireWire, CAT 5, Ethernet, fiber, or any other type of port or interface), to name but a few examples. Input/output device 304 may be comprised of hardware, software, or firmware. It is contemplated that input/output device 304 includes more than one of these adapters, credentials, or ports, such as a first port for receiving data and a second port for transmitting data.

External device 310 in different embodiments is any type of device that allows data to be input to or output from computing device 300. For example, external device 310 in different embodiments is a mobile device, a reader device, equipment, a handheld computer, a diagnostic tool, a controller, a computer, a server, a printer, a display, an alarm, a visual indicator, a keyboard, a mouse, a user device, a cloud device, a circuit, or a touch screen display. Furthermore, it is contemplated that external device 310 is be integrated into computing device 300. It is further contemplated that more than one external device is in communication with computing device 300.

Processing device 302 in different embodiments is a programmable type, a dedicated, hardwired state machine, or a combination thereof. Device 302 may further include multiple processors, Arithmetic-Logic Units (ALUs), Central Processing Units (CPUs), Digital Signal Processors (DSPs), or Field-programmable Gate Array (FPGA), to name but a few examples. For forms of processing device 302 with multiple processing units, distributed, pipelined, or parallel processing may be used as appropriate. Processing device 302 may be dedicated to performance of just the operations described herein or may be utilized in one or more additional applications. In the illustrated form, processing device 302 is of a programmable variety that executes processes and processes data in accordance with programming instructions (such as software or firmware) stored in memory device 306. Alternatively or additionally, programming instructions may be at least partially defined by hardwired logic or other hardware. Processing device 302 may be comprised of one or more components of any type suitable to process the signals received from input/output device 304 or elsewhere, and provide desired output signals. Such components may include digital circuitry, analog circuitry, or a combination of both.

Memory device 306 in different embodiments is of one or more types, such as a solid-state variety, electromagnetic variety, optical variety, or a combination of these forms, to name but a few examples. Furthermore, memory device 306 may be volatile, nonvolatile, transitory, non-transitory or a combination of these types, and some or all of memory device 306 may be of a portable variety, such as a disk, tape, memory stick, cartridge, to name but a few examples. In addition, memory device 306 may store data that is manipulated by processing device 302, such as data representative of signals received from or sent to input/output device 304 in addition to or in lieu of storing programming instructions, to name but a few examples. As shown in FIG. 3, memory device 306 may be included with processing device 302 or coupled to processing device 302, but need not be included with both.

Figure 4:
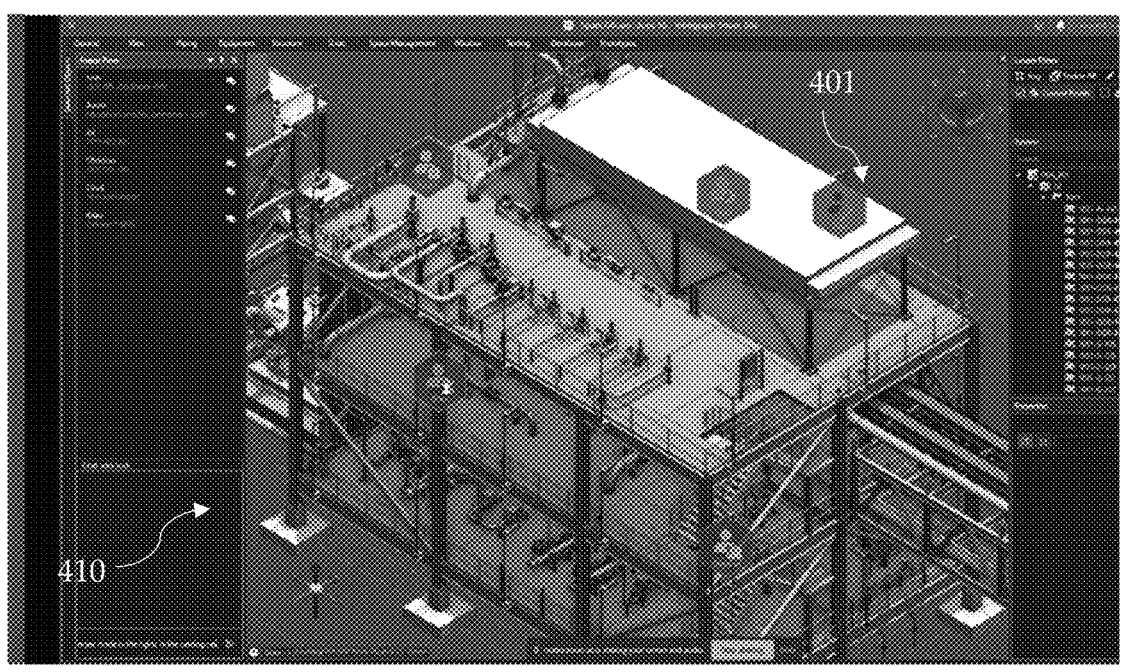
FIG. 4 schematically shows an exemplary virtual environment that may be used with illustrative embodiments.
Figure 4:
Figure 5:
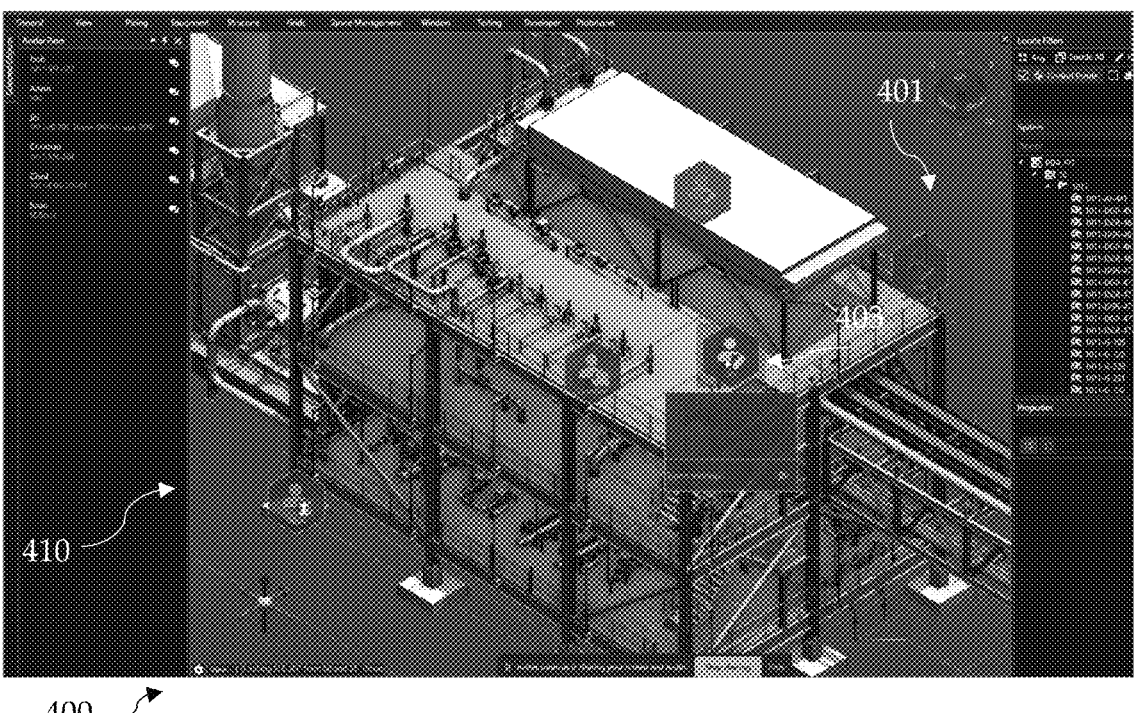
FIG. 5 schematically shows an update to the exemplary virtual environment in FIG. 2.

FIGS. 4-5 show a user interface 400 including a virtual environment 410 updated in real-time as users interact with design files of the illustrated capital project. Virtual environment 410 includes a plurality of avatar representations, such as representations identified in the figures by reference numbers 401 and 403. As discussed above, the avatar representations are positioned in the virtual embodiment as a function of the locations of objects on which the users are working. For example, the location of avatar representation 401 in FIG. 4 is repositioned in FIG. 5 to reflect that user Josh has begun interacting with a design file corresponding to a new and/or different object in the capital project.

FIG. 5 illustrates a user having selected avatar representation 403, causing a chat session to open, allowing the user to chat with user Jiti. In this way, the virtual environment enables instant communication with other users. In certain embodiments, messages sent between users may be stored and displayed to an offline user when the user returns. It shall be appreciated that features of virtual environment 410 may be present in other virtual environments described herein. Some embodiments can pass files to other users via the chat window or other communication interface associated with the avatar representation.

Figure 6:
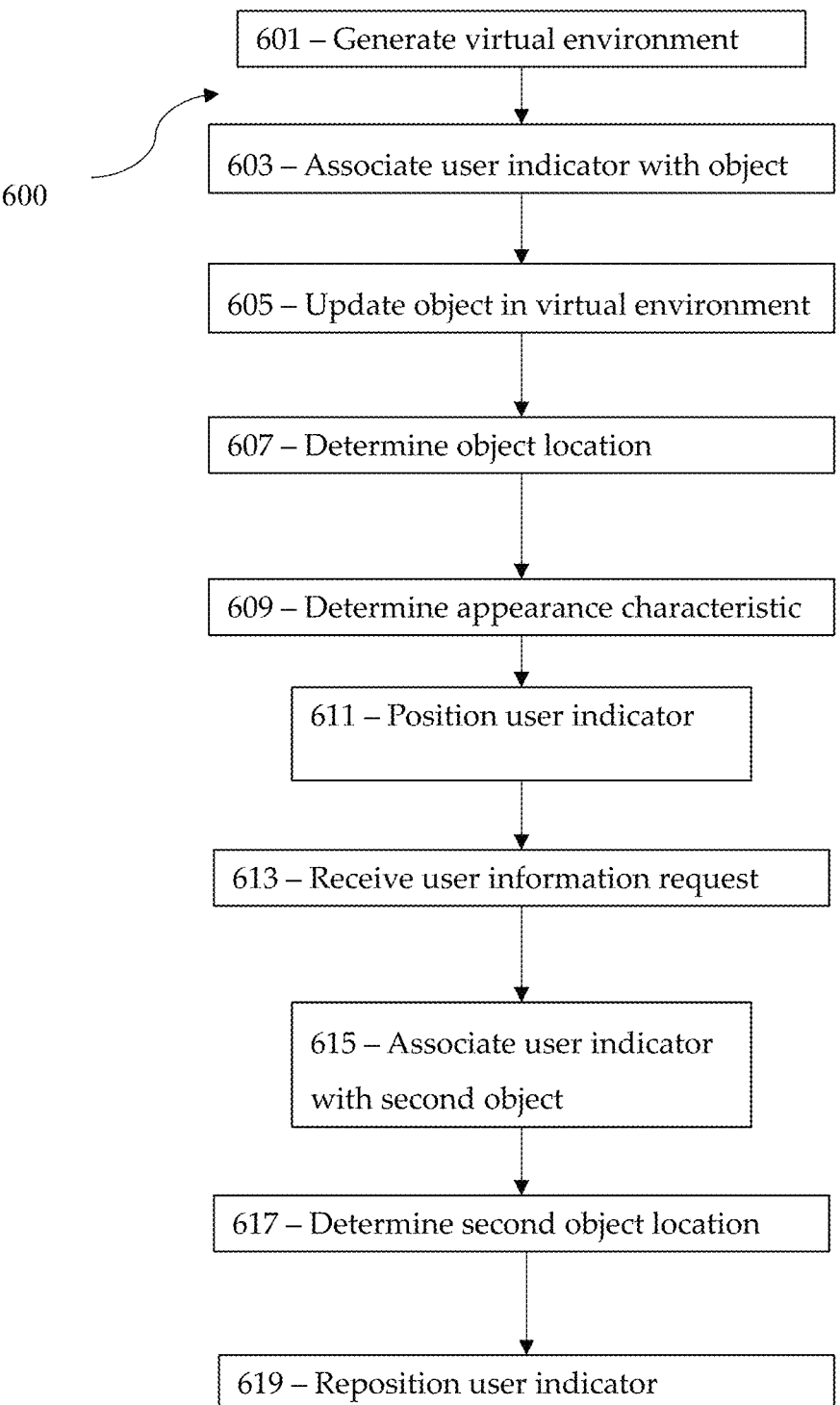
FIGS. 6-7 are flowcharts illustrating exemplary processes for operating an exemplary virtual environment.

FIG. 6 shows an exemplary process 600 for managing a large-scale capital project in accordance with illustrative embodiment. Process 600 (as well as Process 700, discussed below) may be implemented in whole or in part in one or more of the project management systems disclosed herein. In certain forms the functionalities may be performed by separate cloud devices or user devices of the project management system. In certain forms all functionalities may be performed by the same device. It shall be further appreciated that a number of variations and modifications to Process 600 and Process 700 are contemplated including, for example, the omission of one or more aspects of Process 600 or Process 700, the addition of further conditionals and operations, or the reorganization or separation of operations and conditionals into separate processes.

Process 600 begins at operation 601 where the project management system generates a virtual environment representing the large-scale capital project. The virtual environment includes a plurality of objects. The characteristics of each object are defined by one or more of a plurality of design files. These design files also may have metadata for additional purposes, such as identifying the type of object or other known uses.

Then, at operation 603, the project management system provides a user with access to a given design file corresponding with a given object (or a plurality of objects). This may be executed in response to a request from the user (e.g., selecting a button or selecting the given object) and confirming access policies of the organization managing the project. Then, the project management system locates, generates, or otherwise produces a user indicator to associate that user indicator with a given object in the virtual environment. Alternatively, the system may associate the user indicator with the appropriate design file in response to the user accessing the file, or in response to the user modifying or adding the file.

The user may modify the given object. Accordingly, at operation 605, the project management system updates the given object in the virtual environment in response to that modification of the given object. For example, the system may modify the size of the object in response to a change, by the user, of the size characteristic specified in the design file.

The project management system determines the location of the given object in the virtual environment (operation 607). In certain embodiments, the location may include the position of a multidimensional box (e.g., a virtual bounding box) that contains the object, or the position of a center point of the object, to name but a few examples.

Process 600 then proceeds to operation 609, where the project management system assigns an appearance characteristic of the user indicator in the virtual environment. Among other ways, the project management system may determine this characteristic in response to all of or a portion of one or more objects located proximate to the given object. As described above, an appearance characteristic may be changed when two users begin to work in proximity to one another, to name but one example. Also, as noted above, the appearance characteristic of the user indicator may be assigned using some other criteria, such as functional relationship—without regard to any specific location.

Operation 611 then positions a visual representation of the user indicator in the virtual environment as a function of the location of the given object. The visual representation of the user indicator preferably includes the interactive interface for user information, which may be selected to reveal further information about its associated user and/or to establish a communication channel with the user.

The project management system then receives, at operation 613, a request via the interactive interface to contact a user. For example, using their user device, a user may transmit a request to access the user information by selecting the visual representation of the user indicator.

Process 600 proceeds to operation 615 where the project management system associates the user indicator with a second object of the plurality of objects after access to a second file. The second file includes at least one of the plurality of files and is associated with the second object in the virtual environment.

After the project management system determines the location of the second object in the virtual environment at operation 617, operation 619 repositions the visual representation of the user indicator in the virtual environment as a function of the location of the second object. In this way, the virtual environment reflects a real-time or near real-time representation of which design files are being accessed/modified/added by users even though one or more updated design files have not been incorporated into the model.

Figure 7:
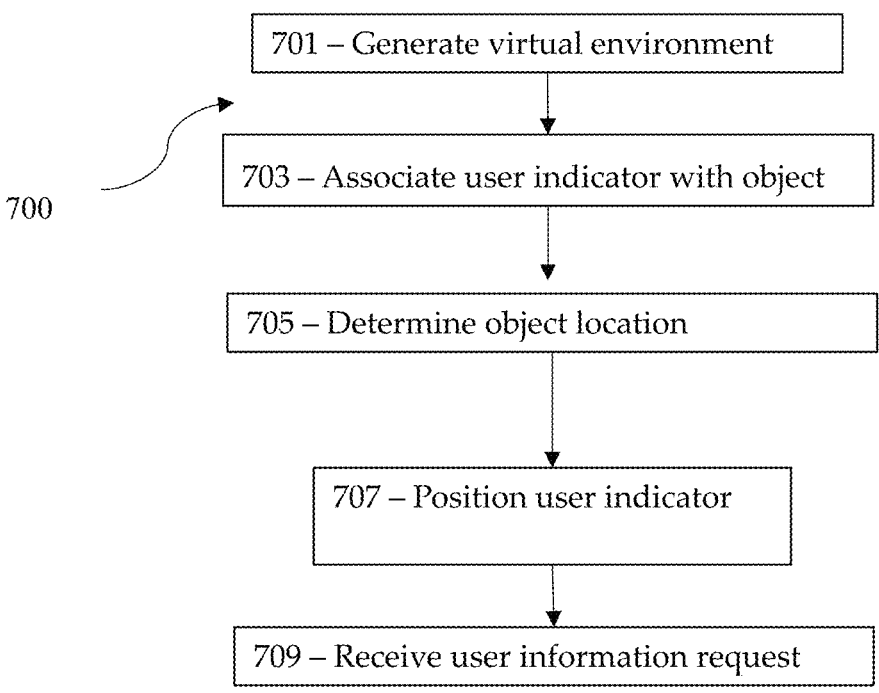

FIG. 7 shows an exemplary process 700 for managing a large-scale capital project in accordance with another embodiment. As noted above with regard to Process 600, Process 700 may be implemented in whole or in part in one or more of the project management systems disclosed herein. In certain forms the functionalities may be performed by separate cloud devices or user devices of the project management system. In certain forms all functionalities may be performed by the same device. It shall be further appreciated that a number of variations and modifications to process 700 are contemplated including, for example, the omission of one or more aspects of process 700, the addition of further conditionals and operations, or the reorganization or separation of operations and conditionals into separate processes.

Process 700 begins at operation 701 where the renderer generates a virtual environment representing the large-scale capital project. The user associator associates a user indicator with a given object of the plurality of objects after a user accesses a given file. The given file is at least one of the plurality of files. The given file is associated with the given object in the virtual environment.

Then, at operation 705, the renderer determines the location of the given object in the virtual environment. The renderer then positions, at operation 707, a visual representation of the user indicator in the virtual environment as a function of the location of the given object. The visual representation of the user indicator includes an interactive interface for user information.

Process 700 concludes at operation 709, where a user input receives a request via the interactive interface to contact a user corresponding to the user indicator.

It is contemplated that the various aspects, features, processes, and operations from the various embodiments may be used in any of the other embodiments unless expressly stated to the contrary. Certain operations illustrated may be implemented by a computer executing a computer program product on a non-transient, computer-readable storage medium, where the computer program product includes instructions causing the computer to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred" or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection to, another item, as well as a belonging to, or a connection with, the other item as informed by the context in which it is used. The terms "coupled to," "coupled with" and the like include indirect connection and coupling, and further include but do not require a direct coupling or connection unless expressly indicated to the contrary. When the language "at least a portion" and/or "a portion" is used, the item can include a portion and/or the entire item unless specifically stated to the contrary. When the language "at least a portion" or "a portion" is used, the item can include a portion or the entire item unless specifically stated to the contrary. Unless stated explicitly to the contrary, the terms "or" and "and/or" in a list of two or more list items may connote an individual list item, or a combination of list items. Unless stated explicitly to the contrary, the transitional term "having" is open-ended terminology, bearing the same meaning as the transitional term "comprising."

Various embodiments of the invention may be implemented at least in part in any conventional computer programming language. For example, some embodiments may be implemented in a procedural programming language (e.g., "C"), or in an object oriented programming language (e.g., "C++"). Other embodiments of the invention may be implemented as a pre-configured, stand-along hardware element and/or as preprogrammed hardware elements (e.g., application specific integrated circuits, FPGAs, and digital signal processors), or other related components.

In an alternative embodiment, the disclosed apparatus and methods (e.g., see the various flow charts described above) may be implemented as a computer program product for use with a computer system. Such implementation may include a series of computer instructions fixed either on a tangible, non-transitory medium, such as a computer readable medium (e.g., a diskette, CD-ROM, ROM, or fixed disk). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). In fact, some embodiments may be implemented in a software-as-a-service model ("SAAS") or cloud computing model. Of course, some embodiments of the invention may be implemented as a combination of both software (e.g., a computer program product) and hardware. Still other embodiments of the invention are implemented as entirely hardware, or entirely software.

The embodiments of the invention described above are intended to be merely exemplary; numerous variations and modifications will be apparent to those skilled in the art. Such variations and modifications are intended to be within the scope of the present invention as defined by any of the appended claims. It shall nevertheless be understood that no limitation of the scope of the present disclosure is hereby created, and that the present disclosure includes and protects such alterations, modifications, and further applications of the exemplary embodiments as would occur to one skilled in the art with the benefit of the present disclosure.

What is claimed is:

1. A method for managing a large-scale capital project, the method comprising:

generating a virtual environment representing the large-scale capital project, the virtual environment including a plurality of virtual objects representing associated physical components of the-large scale capital project, the virtual objects including one or more of a smokestack, pipes, valve, fuel tank, ladder, or electrical system, each of the plurality of virtual objects corresponding to a design object of at least one of a plurality of computer-aided design files;

monitoring access to the plurality of computer-aided design files to determine a first design file the plurality of computer-aided design files is being accessed by a first user;

associating a first user indicator with a first virtual object of the plurality of virtual objects based on the first design file being a given computer-aided design file associated with the first virtual object;

determining a location of the first virtual object in the virtual environment;

positioning a visual representation of the first user indicator in the virtual environment as a function of the location of the first virtual object, the visual representation of the first user indicator including an interactive interface; and receiving a request via the interactive interface from a second user to contact the first user in response to the second user working on or accessing a second computer-aided design file associated with a second virtual object that is proximate to, or shares a multi-dimensional space with, the first virtual object, the second virtual object including one or more of a smokestack, pipes, valve, fuel tank, ladder, or electrical system, the associated physical component of the second virtual object in conflict with a physical location of the first virtual object, wherein the request is received prior to the virtual environment being refreshed to incorporate modifications to the second computer-aided design file, to coordinate design work and mitigate a potential design conflict between the first virtual object and the second virtual object.

2. The method of claim 1, wherein associating the first user indicator with the first virtual object occurs in response to a modification of a given design object of the given computer-aided design file by a user corresponding to the first user indicator.

3. The method of claim 2, further comprising:

updating the first virtual object in the virtual environment in response to the modification of the given design object by the first user.

4. The method of claim 1, comprising:

determining a location of the first virtual object in the virtual environment, the positioning the visual representation of the first user indicator in the virtual environment being a function of the location of the first virtual object;

associating the first user indicator with a second virtual object of the plurality of virtual objects after access to a second computer-aided design file, the second computer-aided design file being at least one of the plurality of computer-aided design files, the second computer-aided design file being associated with the second virtual object in the virtual environment;

determining a second location of the second virtual object in the virtual environment; and repositioning the visual representation of the first user indicator in the virtual environment as a function of the second location of the second virtual object.

5. The method of claim 1, comprising:

assigning an appearance characteristic of the first user indicator in the virtual environment in response to at least a portion of the plurality of virtual objects being located proximate to the first virtual object.

6. The method of claim 1, wherein the interactive interface includes user information relating to the first user, and wherein the received request via the interactive interface to contact the first user includes a request to access to the user information.

7. The method of claim 1, wherein the first user indicator includes a work classification visual representation.

8. A system for managing a large-scale capital project, comprising:

a renderer circuit configured to generate a virtual environment representing the large-scale capital project, the virtual environment including a plurality of virtual objects representing associated physical objects, the virtual objects including one or more of a smokestack, pipes, valve, fuel tank, ladder, or electrical system, each of the plurality of virtual objects corresponding to a design object of at least one of a plurality of computer-aided design files;

a user associator circuit operatively coupled with the renderer circuit, the user associator circuit configured to monitor access to the plurality of computer-aided design files to determine a first design file the plurality of computer-aided design files is being accessed by a first user and associate a first user indicator with a first virtual object of the plurality of virtual objects based on the first design file being a given computer-aided design file associated with the first virtual object, the renderer circuit further configured to determine a location of the first virtual object in the virtual environment, and to position a visual representation of the first user indicator in the virtual environment as a function of the location of the first virtual object, the visual representation of the first user indicator including an interactive interface; and a user input circuit configured to receive, from a user device, a request from a second user via the interactive interface to contact the first user in response to the second user working on or accessing a second computer-aided design file associated with a second virtual object that is proximate to, or shares a multi-dimensional space with, the first virtual object, the second virtual object including one or more of a smokestack, pipes, valve, fuel tank, ladder, or electrical system, the associated physical component of the second virtual object in conflict with a physical location of the first virtual object, wherein the request is received prior to the virtual environment being refreshed to incorporate modifications to the second computer-aided design file, to coordinate design work and mitigate a potential design conflict between the first virtual object and the second virtual object.

9. The system of claim 8, wherein the user associator circuit is configured to associate the first user indicator with the first virtual object in response to a modification of a given design object of the given computer-aided design file by the first user corresponding to the first user indicator.

10. The system of claim 9, wherein the renderer circuit is configured to update the first virtual object in the virtual environment in response to the modification of the given design object by the first user.

11. The system of claim 8, wherein:

the user associator circuit is further configured to associate the first user indicator with a second virtual object of the plurality of virtual objects after access to a second computer-aided design file, the second computer-aided design file being at least one of the plurality of computer-aided design files, the second computer-aided design file being associated with the second virtual object in the virtual environment; and the renderer circuit further configured to determine a second location of the second virtual object in the virtual environment, and reposition the visual representation of the first user indicator in the virtual environment as a function of the second location of the second virtual object.

12. The system of claim 8, wherein the renderer circuit is configured to determine an appearance characteristic of the first user indicator in the virtual environment in response to a portion of the plurality of virtual objects being located proximate to the first virtual object.

13. The system of claim 8, wherein the first user indicator includes an avatar representation of the first user, and the avatar representation includes a work classification visual representation.

14. A computer program product for use on a computer system for managing a large-scale capital project, the computer program product comprising a tangible, non-transient computer usable medium having computer readable program code thereon, the computer readable program code comprising:

program code for generating a virtual environment representing the large-scale capital project, the virtual environment including a plurality of virtual objects representing associated physical objects, the virtual objects including one or more of a smokestack, pipes, valve, fuel tank, ladder, or electrical system, each of the plurality of virtual objects corresponding to a design object of at least one of a plurality of computer-aided design files;

program code for monitoring access to the plurality of computer-aided design files to determine a first design file the plurality of computer-aided design files is being accessed by a first user;

program code for associating a first user indicator with a first virtual object of the plurality of virtual objects based on the first design file being a given computer-aided design file associated with the first virtual object;

program code for determining a location of the first virtual object in the virtual environment;

program code for positioning a visual representation of the first user indicator in the virtual environment as a function of the location of the first virtual object, the visual representation of the first user indicator including an interactive interface; and program code for receiving a request from a second user via the interactive interface to contact the first user in response to the second user working on or accessing a second computer-aided design file associated with a second virtual object that is proximate to, or shares a multi-dimensional space with, the first virtual object, the second virtual object including one or more of a smokestack, pipes, valve, fuel tank, ladder, or electrical system, the associated physical component of the second virtual object in conflict with a physical location of the first virtual object, wherein the request is received prior to the virtual environment being refreshed to incorporate modifications to the second computer-aided design file, to coordinate design work and mitigate a potential design conflict between the first virtual object and the second virtual object.

15. The computer program product of claim 14, wherein associating the first user indicator with the first virtual object occurs in response to a modification of a given design object of the given computer-aided design file by the first user corresponding to the first user indicator.

16. The computer program product of claim 15, further comprising:

program code for updating the first virtual object in the virtual environment in response to the modification of the given design object by the first user.

17. The computer program product of claim 14, comprising:

program code for determining a location of the first virtual object in the virtual environment, the positioning the visual representation of the first user indicator in the virtual environment being a function of the location of the first virtual object;

program code for associating the first user indicator with a second virtual object of the plurality of virtual objects after access to a second computer-aided design file, the second computer-aided design file being at least one of the plurality of computer-aided design files, the second computer-aided design file being associated with the second virtual object in the virtual environment;

program code for determining a second location of the second virtual object in the virtual environment; and program code for repositioning the visual representation of the first user indicator in the virtual environment as a function of the second location of the second virtual object.

18. The computer program product of claim 14, comprising:

program code for assigning an appearance characteristic of the first user indicator in the virtual environment in response to at least a portion of the plurality of virtual objects being located proximate to the first virtual object.

19. The computer program product of claim 14, wherein the first user indicator includes an avatar representation of the first user.

20. The computer program product of claim 19, wherein the avatar representation includes a work classification visual representation.

\* \* \* \* \*